United States Patent [19]
Frank et al.

[11] Patent Number: 5,565,682
[45] Date of Patent: Oct. 15, 1996

[54] ELECTRICAL CONTACT TO THE COMMON ELECTRODE OF AN INFRARED DETECTOR ARRAY

[75] Inventors: Steven N. Frank, McKinney; James F. Belcher; Charles E. Stanford, both of Plano; Robert A. Owen; Robert J. S. Kyle, both of Rowlett, all of Tex.

[73] Assignee: Texas Instruments Incorporated, Dallas, Tex.

[21] Appl. No.: 475,959

[22] Filed: Jun. 7, 1995

Related U.S. Application Data

[62] Division of Ser. No. 397,512, Mar. 1, 1995.

[51] Int. Cl.$^6$ ........................................ G01J 5/02
[52] U.S. Cl. .................. 250/338.1; 250/349; 250/332
[58] Field of Search ........................ 250/338.1, 338.3, 250/332, 349

[56] References Cited

U.S. PATENT DOCUMENTS

| | | | |
|---|---|---|---|
| 4,806,762 | 2/1989 | Turnbull | 250/338.3 |
| 4,927,771 | 5/1990 | Ferrett | 250/332 X |
| 5,030,827 | 7/1991 | Powell | 250/338.1 |

FOREIGN PATENT DOCUMENTS

| | | | |
|---|---|---|---|
| 63-131032 | 6/1988 | Japan | 250/338.3 |
| 2-69624 | 3/1990 | Japan | 250/338.3 |

*Primary Examiner*—Carolyn E. Fields
*Assistant Examiner*—Edward J. Glick
*Attorney, Agent, or Firm*—Ruben C. DeLeon; James C. Kesterson; Richard L. Donaldson

[57] ABSTRACT

A system for infrared sensing has thermally sensitive picture elements within a substrate; bias contact areas within the substrate and around a periphery of the thermally sensitive picture elements; a common electrode on a front side of the thermally sensitive picture elements and the bias contact areas; an optical coating on top of the common electrode; a first electrical contact metal on a backside of the thermally sensitive picture elements; and a second electrical contact metal connected to the bias contact areas on a backside of the bias contact areas and electrically connected to the common electrode. The bias contact areas may include a conductive substrate area. In addition, the device may be connected to an integrated circuit by an ohmic connection to the first and/or the second electrical contact metal.

7 Claims, 5 Drawing Sheets

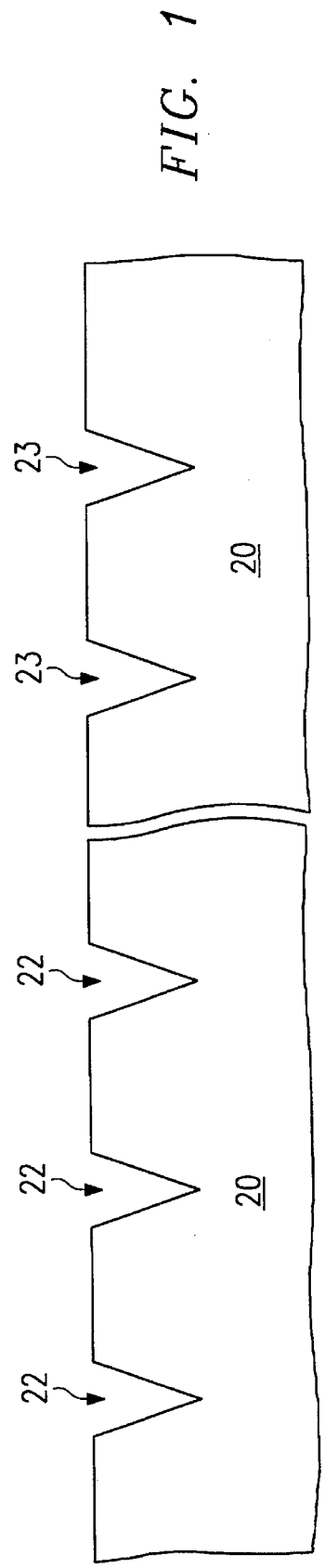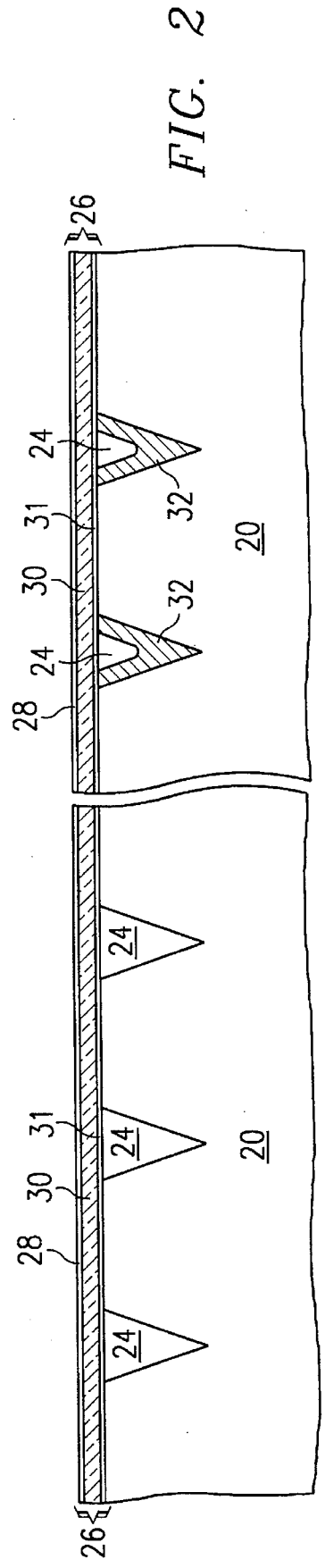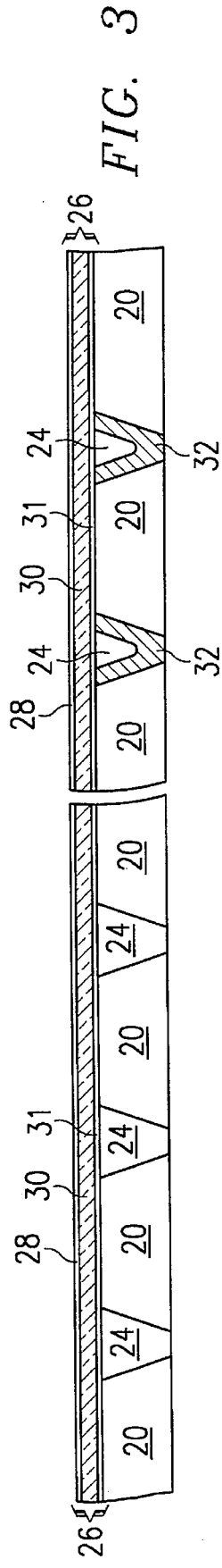

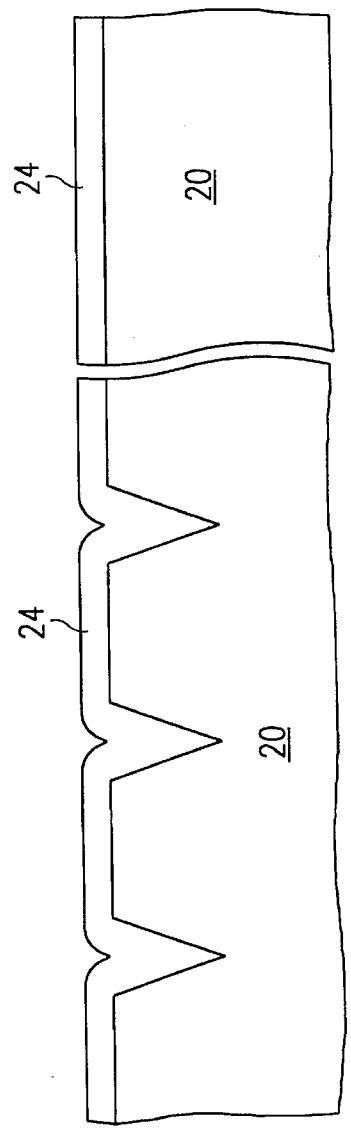
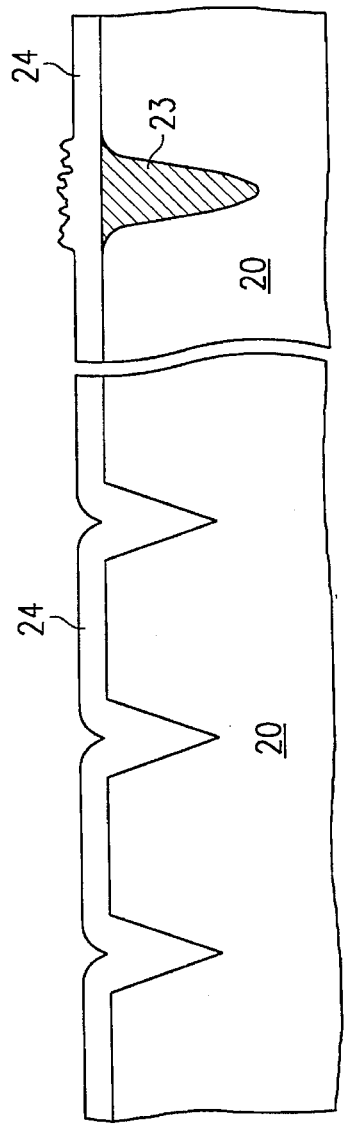
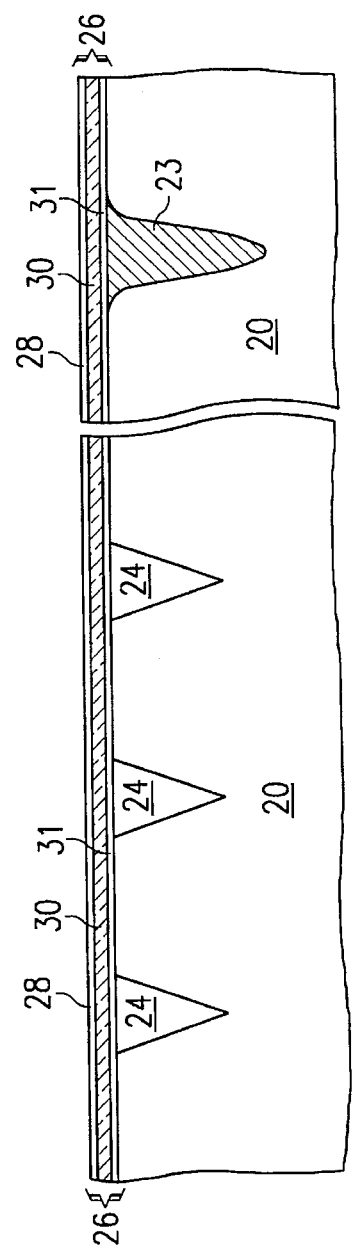

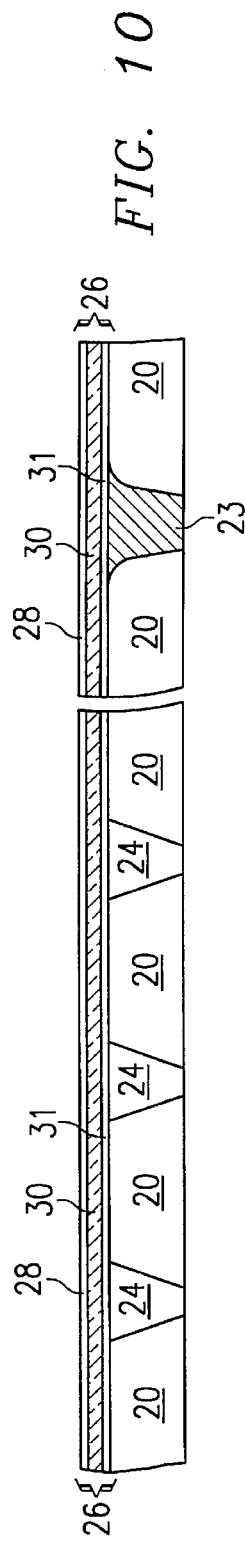
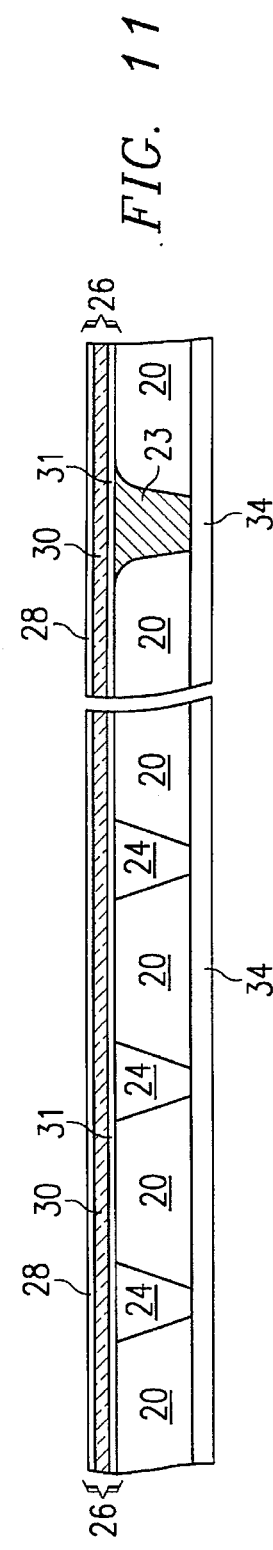
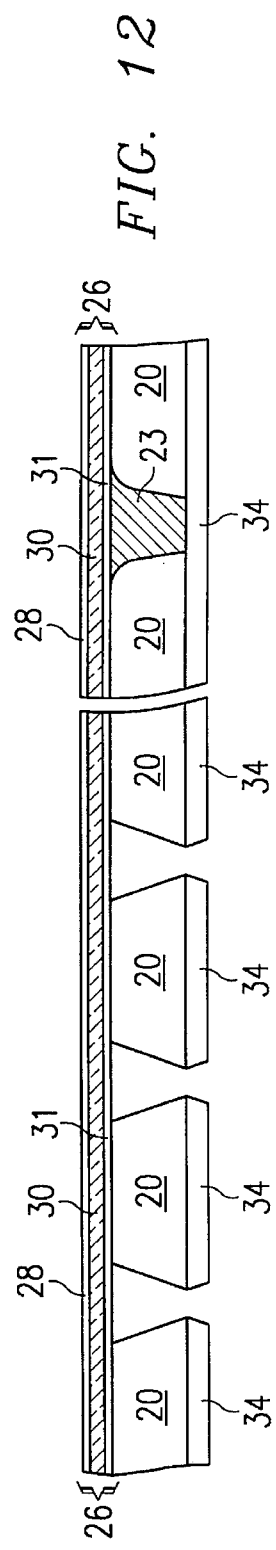

ELECTRICAL CONTACT TO THE COMMON ELECTRODE OF AN INFRARED DETECTOR ARRAY

CROSS-REFERENCE TO RELATED APPLICATION

This is a divisional of application Ser. No. 08/397,512, filed Mar. 1, 1995.

The following coassigned patent applications and U.S. patent are hereby incorporated herein by reference: U.S. patent application Ser. No. 08/223,073, filed Apr. 4, 1994; U.S. patent application Ser. No. 08/223,008, filed Apr. 4, 1994; and, U.S. Pat. No. 5,466,332, filed Apr. 4, 1994.

FIELD OF THE INVENTION

This invention generally relates to infrared (IR) detector arrays and means of fabrication.

BACKGROUND OF INVENTION

The novel IR devices and fabrication processes to be described are related to the types of IR detector arrays recorded in (1) U.S. Pat. No. 4,080,532, Hopper, March 1978; (2) U.S. Pat. No. 4,745,278, Hanson, May 1988; (3) U.S. Pat. No. 4,792,681, Hanson, December 1988; (4) "LOW-COST UNCOOLED FOCAL PLANE ARRAY TECHNOLOGY", by Hanson, Beratan, Owen and Sweetser; presented Aug. 17, 1993 at the IRIS Detector Specialty Review; (5) cross-referenced U.S. Pat. No. 5,466,332, filed Apr. 04, 2994, (6) cross-referenced U.S. patent application Ser. No. 08/223,088, filed Apr. 04, 1994, and (7) cross-referenced U.S. patent application Ser. No. 08/223,073, filed Apr. 04, 1994.

The physical requirements of uncooled arrays and a description of fabrication processes are covered in some detail in the above references. A line scanner may contain from several hundred to a few thousand and an area imager several thousand to tens of thousand individual picture elements (pixels.) Each of these pixels consists of a capacitor that has a heat (IR intensity) sensitive dielectric such as barium titanate (BST). The electronic connections to these capacitors are greatly simplified if one of the capacitor terminals is made common to all. Previously described in the references are methods to attach hundreds to tens of thousands of electrical connections between the other isolated terminals of the pixel capacitors and the electronic sensing circuitry housed on an external integrated circuit (IC). In addition, the pixel capacitors must be thermally isolated from each other while having one terminal connected to all the other common terminals.

The common connection to one side of the pixel capacitors consists of a front side thin film referred to as the optical coating. This may be a composite of a plurality of thin films having the desired physical properties, such as IR transparency, electrical conductivity, thermal conductivity, etc. The thicker heat sensitive dielectric substrate in this case can be barium-strontium-titanate (BST) which is a ceramic like material.

SUMMARY OF THE INVENTION

Most of the previous inventions are concerned with how to achieve thermally isolated pixels and attach them to a companion silicon integrated circuit without damage to the fragile IR sensing array circuitry. The IR sensing side of the array contains the previously mentioned optical coating. This typically consists of three or four layers. The outermost layer is a semitransparent thin metal film such as nichrome (NiCr). The underlying wavelength tuning layer has a thickness of an odd number of quarter wavelengths at the desired IR wavelength. This tuning layer is transparent to IR and may be parylene. The underlying metal completes the optical filter properties and may also be the sole electrical contact for a common electrical connection to all the pixels. Typically this layer is a thicker film of NiCr. An improved structure, such as described in the references, may have a more rugged fourth layer. Sometimes this fourth layer results in a structure referred to as an elevated optical coating.

Although much detail and many variants of the pixel isolation and connection processes are described in the references, not mentioned is the method whereby the common electrode of the optical layer is electrically connected to a voltage or current biasing supply. Heretofore this has been accomplished in a very primitive and unreliable manner by physically scraping away the top two coatings of the optical layer at the periphery of the IR sensing array and attaching a free wire with electrically conducting epoxy.

This invention describes novel means of effecting this common electrode biasing connection in a more production worthy and reliable manner. This is a system and method of forming an electrical contact to the optical coating of an infrared detector. The method may comprise: forming thermal isolation trenches and contact vias in a substrate; depositing a bias contact metal into the vias forming biasing contact areas around a periphery of the substrate; depositing a first trench filler in the trenches and vias; replanarizing; depositing a common electrode layer over the thermal isolation trenches and the biasing contact areas; mechanically thinning the substrate to expose the biasing contact area and the trench filler; depositing a contact metal on the backside of the substrate, the exposed trench filler and the exposed bias contact area; and etching the contact metal and the trench filler to form pixel mesas of the contact metal and the substrate. The thermal isolation trenches and the bias contact vias may be formed by ion milling or laser vaporization.

Alternately, the bias contact areas may be formed by performing laser vaporization on the substrate to produce conductive areas within the substrate. This System and method may be applied to uncooled as well as cooled infrared detectors.

DESCRIPTION OF THE DRAWINGS

This invention can be best understood by reference to the following drawing(s), in which:

FIG. 1 shows a cross sectional sketch of an array laser patterned from the front side of a first embodiment;

FIG. 2 shows the optical coating applied over the sensing and common biasing contact area;

FIG. 3 depicts the mechanically thinned composite array with biasing contact area;

FIG. 7 shows deposition of parylene over the sensing array;

FIG. 8 shows the structure after laser vaporization creams a conductive area of the substrate for the bias contact area;

FIG. 9 shows the optical coating applied over the sensing and common biasing contact area;

FIG. 10 depicts the mechanically thinned composite array with biasing contact area;

FIG. 11 indicates the application of contact metal to the backside of the array including the biasing contact;

FIG. 12 shows the final array structure ready for bonding to the companion IC;

Corresponding numerals and symbols in different figures refer to corresponding parts unless otherwise indicated.

DETAILED DESCRIPTION OF PREFERRED EMBODIMENTS

Figure 4:
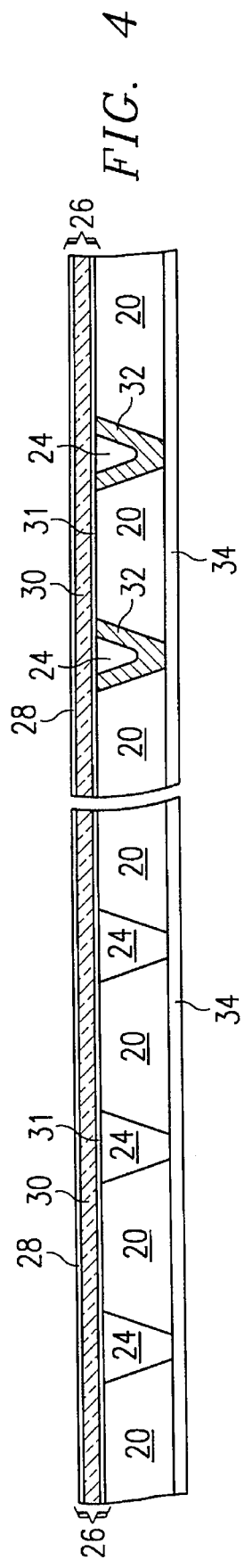
FIG. 4 indicates the application of contact metal to the backside of the array including the biasing contact.

One preferred embodiment will be described with the aid of FIGS. 1–5 and TABLE 1. The figures have exaggerated layer thicknesses for descriptive purpose and are not to actual or relative scale to each other. In this embodiment, the BST substrate 20 is patterned from the front or optically sensitive side of the sensing array by the use of a laser to vaporize the substrate thereby forming thermal isolation trenches 22 between the thermally sensitive picture elements (pixels). As shown in FIG. 1, the vias 23 for the biasing contacts are formed in the same manner. These vias 23 are removed from the IR sensing area and have multiple locations around the border of the array. Although shown in these figures to be the same size as the thermal isolation trenches 22, these vias 23 may be larger if desired.

FIG. 2 exhibits the structure after several processing steps have been completed from FIG. 1. Trenches 22 have been fried with parylene 24 and the surface has been mechanically polished to planarize the front side of the BST substrate 20. In addition, a biasing contact metal 32 has been deposited in vias 23. One method of depositing the biasing contact metal 32 is covering the array with a mask that has openings only around the vias 23. A metal such as indium would then be deposited. Any excess of the biasing contact metal 32 would then be removed with the mask. Prior to the application of the optical coating 26, parylene 24 would then be deposited and planarized to make the vias 23 level with the rest of the device. Various modifications could be made to this sequence to produce the same structure. In addition, various other methods could be used to produce a layer of the bias contact metal 32 in the vias 23 and not alter the functionality. After the completion of the deposition of the bias contact metal 32 and parylene 24, a three level optical coating 26 is deposited over all the pixels and bias contact vias 23. The materials and thicknesses are shown in TABLE 1. The common electrode in this case is 31 and provides the functions of one side of the pixel capacitors and an electrical contact to the bias metal 32.

In FIG. 3 the substrate 20 has been thinned from the back side by mechanical polishing means to expose the parylene 24 and bias contact metal 32.

FIG. 4 shows the deposition of the back side contact metal 34 which typically consists of the alloys shown in TABLE 1. This metal 34 is in ohmic contact with the bias metal 32.

Figure 5:
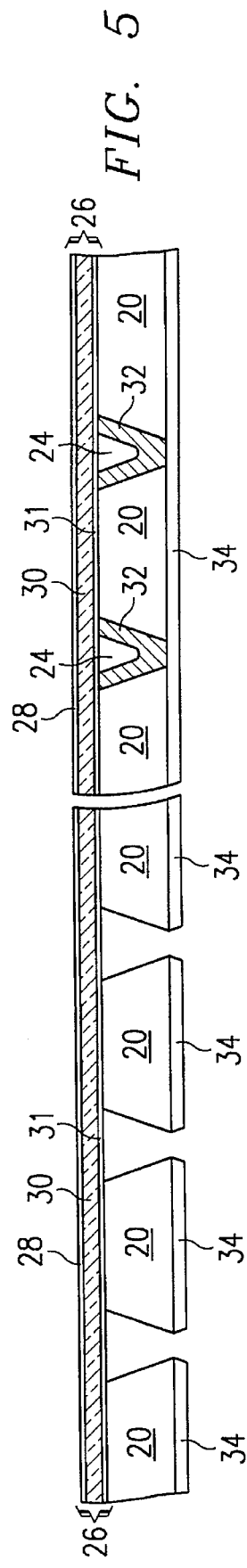
FIG. 5 shows the final array structure ready for bonding to the companion IC.
Figure 6:
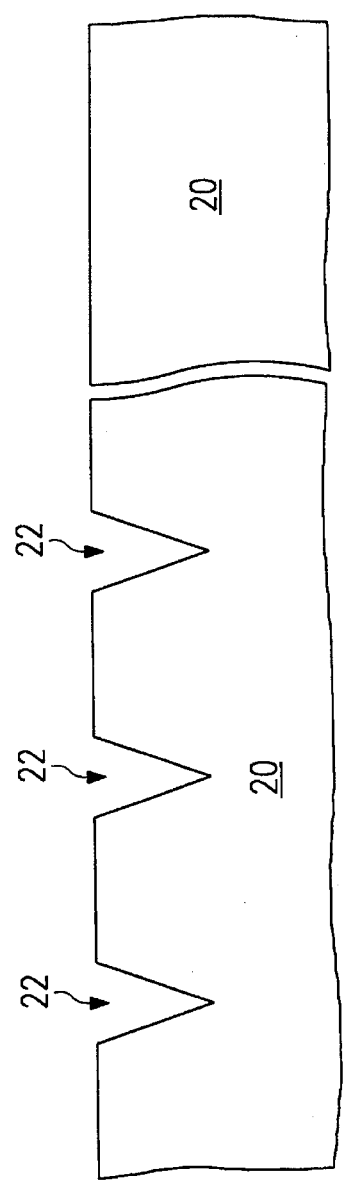
FIG. 6 shows a cross sectional sketch of an array laser patterned from the front side of the second embodiment.

After the use of standard photolithography, etching and cleaning techniques, the structure shown in FIG. 5 results. The capacitor pixel mesas 20 are deemed by optical coating 26 on the front, as the thermally sensitive insulator 20 and contact metal 34 make up the other side of the capacitor. The contact metal 34 also is patterned over the bias contact metal 32. IC bonding may now be performed to all the pixel mesas and the biasing pads. This establishes an electrical connection for the common pixel electrode bias voltage through 34 to 32 to 31.

TABLE 1

| ID# | Description | Material (dim) | Alternates |
| --- | --- | --- | --- |
| 20 | Thermally sensitive substrate | Barium strontium titanate | |
| 22 | Isolation trenches | Laser vaporized | Ion milled |
| 23 | Bias contact vias | Laser vaporized | Ion milled |
| 24 | Trench filler | Parylene | Photoresist, PMMA, epoxy |
| 26 | Optical coating | 3 layered | ¼ IR wavelength |
| 28 | Transparent coat | NiCr 50A | 24–100A |
| 30 | ¼ wavelength separator coat | Parylene 1.4 µm | ¼ wavelength at desired IR |
| 31 | Electrical con-ducting coat | NiCr 1000A | 500–2000A |
| 32 | Bias contact metal | Indium | Ni, TiW, NiCr, Au, thin PRNY film conductor |
| 34 | Backside electrical contact | Multiple alloys suitable for IC bonding. | 4-layer composite of 15–60 µm In 0.5–1.5 µm Au 0.5–1.5 µm NiCr 0.2–1.0 µm TiW |

There are many variant embodiments to provide the biasing connection as a process within the normal fabrication process flow of an IR sensing array which has been thermally isolated from the imaging surface side. Whether the isolation trenches are formed by laser vaporization, ion milling or other means, similar trenches or vias can be patterned at the periphery of the array and filled with an appropriate metal, such as indium. In the case of ion milling, a common electrode may be applied after an elevated optical coating to allow more tolerance in the milling operation. All variants and combinations of these structures are considered within the scope of this invention.

Another preferred embodiment will be described with the aid of FIGS. 6–12 and TABLE 2. Again, the thicknesses of the films are oversized and not to absolute or relative scale to each other. Similarly to the first embodiment, the BST substrate 20 is patterned from the front or optically sensitive side of the sensing array by the use of a laser to vaporize the substrate thereby forming thermal isolation trenches 22 between the thermally sensitive picture elements (pixels). However, the bias contact vias are not formed at this time.

26 on the front, as the thermally sensitive insulator 20 and contact metal 34 make up the other side of the capacitor. The contact metal 34 also is patterned over the bias contact metal 23. IC bonding may now be performed to all the pixel mesas and the biasing pads. This establishes an electrical connection for the common pixel electrode bias voltage through 34 to 23 to 31.

TABLE 2

| ID# | Description | Material (dim) | Alternates |
| --- | --- | --- | --- |
| 20 | Thermally sensitive substrate | Barium strontium titanate | |
| 22 | Isolation trenches | Laser vaporized | Ion milled |
| 23 | Bias contact vias | Laser vaporized | Ion milled |
| 24 | Trench filler | Parylene | Photoresist, PMMA, epoxy |
| 26 | Optical coating | 3 layered | ¼ IR wavelength |
| 28 | Transparent coat | NiCr 50A | 25–100A |
| 30 | ¼ wavelength separator coat | Parylene 1.4 μm | ¼ wavelength at desired IR |
| 31 | Electrical con-ducting coat | NiCr 1000A | 500–2000A |
| 32 | Bias contact | Laser vaporized substrate | |
| 34 | Backside electrical contact | Multiple alloys suitable for IC bonding. | 4-layer composite of 15–60 μm In 0.5–1.5 μm Au 0.5–1.5 μm NiCr 0.2–1.0 μm TiW |

In FIG. 7, parylene 24 is deposited along the surface of the substrate 20 and trenches 22 and, although not intended, could cover the bias contact area.

FIG. 8 shows the embodiment after the bias contact vias 23 are formed. The bias contact via 23 is composed of an area of the substrate 20 made conductive by laser vaporization. Furthermore, if the laser vaporization goes through any parylene 24, it may become distorted, but should not harm the bias contact via 23. These vias 23 have multiple locations around the border of the array. Although shown in these figures to be about the same size as the thermal isolation trenches 22, these vias 23 may be larger if desired.

FIG. 9 exhibits the structure after several processing steps have been completed from FIG. 8 and the surface has been mechanically polished to planarize the front side of the BST substrate 20. Prior to the application of the optical coating 26, the parylene 24 would be planarized to make the trenches 22 and bias contact vias 23 level with the rest of the device. Various modifications could be made to this sequence to produce the same structure. After the completion of bias contact 23 and parylene 24, a three level optical coating 26 is deposited over all the pixels and bias contact vias 23. The materials and thicknesses are shown in TABLE 2. The common electrode in this case is 31 and provides the functions of one side of the pixel capacitors and an electrical contact to the bias contact 23.

In FIG. 10 the substrate 20 has been thinned from the back side by mechanical polishing means to expose the parylene 24 and bias contact 23.

FIG. 11 shows the deposition of the back side contact metal 34 which typically consists of the alloys shown in TABLE 2. This metal 34 is in ohmic contact with the bias contact 23.

Figure 13:
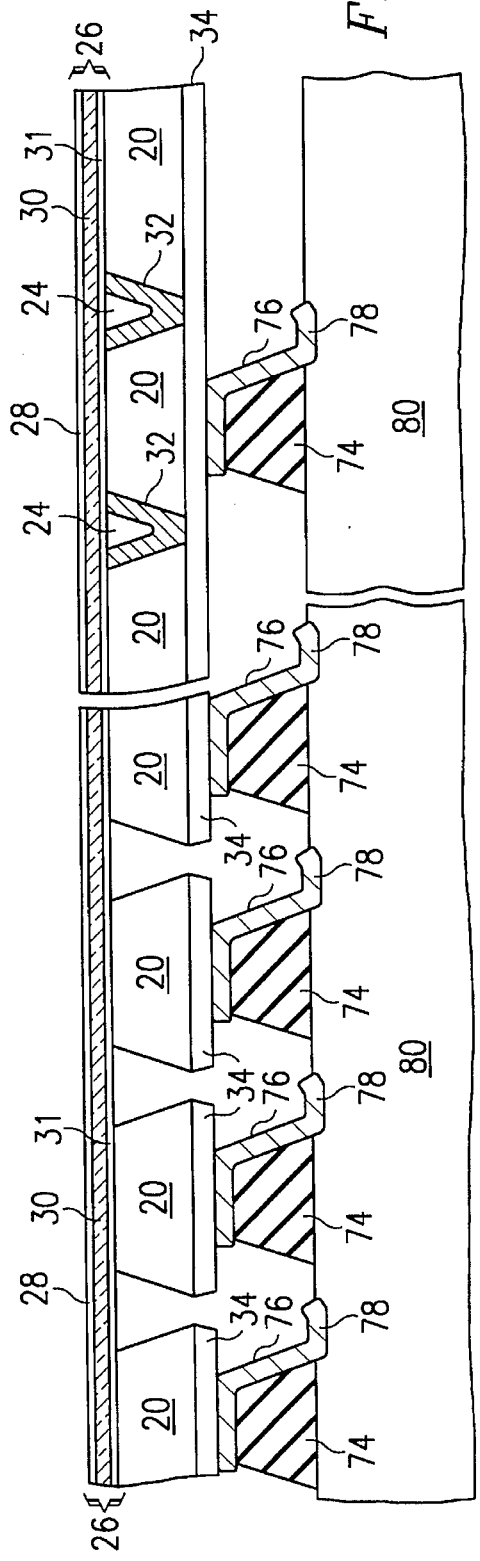
FIG. 13 shows an example implementation of an integrated circuit (IC) bonded to the final array structure of FIG. 5.

After the use of standard photolithography, etching and cleaning techniques, the structure shown in FIG. 12 results. The capacitor pixel mesas 20 are defined by optical coating FIG. 13 shows an example implementation of an integrated circuit bonded to the final array structure of FIG. 5. Corresponding numerals in FIGS. 5 and 13 refer to the corresponding parts already described. However, the new elements are described in Table 3.

Figure 14:
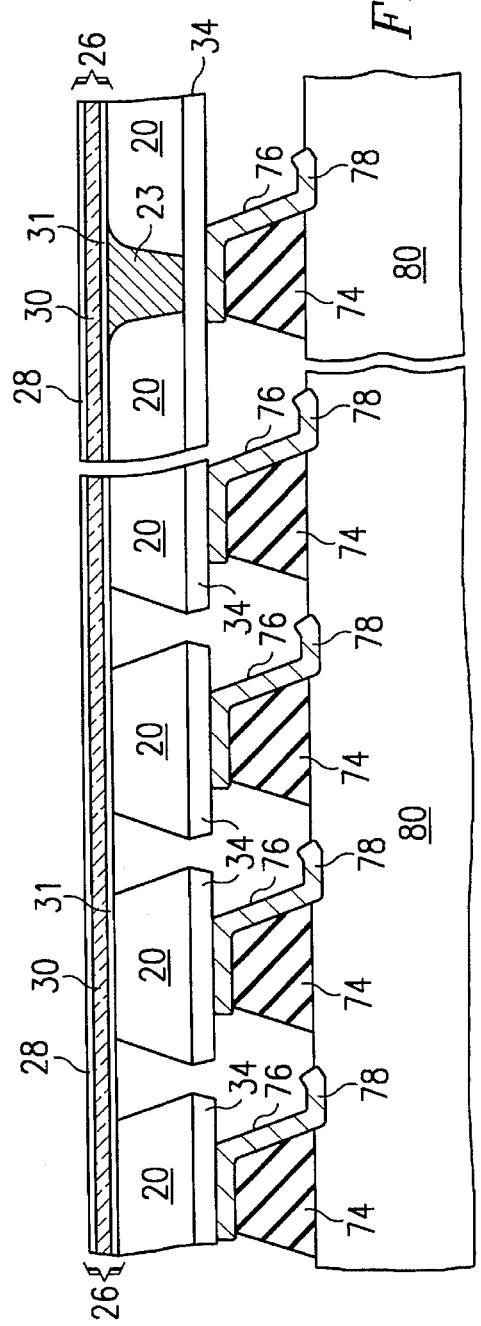
FIG. 14 shows an example implementation of an integrated circuit (IC) bonded to the final array structure of FIG. 12.

FIG. 14 shows an example implementation of an integrated circuit bonded to the final array structure of FIG. 12. Corresponding numerals in FIGS. 12 and 14 refer to the corresponding parts already described. However, the new elements are described in Table 3.

TABLE 3

| ID# | Description | Material (dim) | Alternates |
| --- | --- | --- | --- |
| 74 | IC Contact Mesa | Polyimide 12 μm | 1–20 μm Photoresist, parylene, epoxy |
| 76 | Ohmic Connection | TiW 2000 Å | 100–10,000 Å other metals, conductors |
| 78 | IC via | | |
| 80 | IC processor | Si or GaAs | |

There are many variant embodiments to provide the biasing connection as a process within the normal fabrication process flow of an IR sensing array which has been thermally isolated from the imaging surface side. The isolation trenches may be formed by laser vaporization, ion milling or other means. All variants and combinations of these structures are considered within the scope of this invention.

While this invention has been described with reference to illustrative embodiments, this description is not intended to be construed in a limiting sense. It should be stressed again-that the biasing vias shown in the illustrations were drawn for convenience and ease of description as if they were isolation trench type geometries. These vias are well removed from the sensing area and may be much larger or have many more to cover a more extensive area than shown in the figures. In some embodiments of these novel IR sensors, thermal isolation of the pixel capacitors is performed by partial etching from one side followed by etching to completion on the other side as has been described in the references. All of these methods can have the biasing vias patterned as a normal part of the process flow. In addition, this invention is not to be limited to uncooled infrared detectors. For example, this invention could be easily incorporated into the normal process flow for cooled infrared detectors as well.

Various modifications have already been described but other modifications and combinations of the illustrative embodiments, as well as other embodiments of the invention, will be apparent to persons skilled in the art upon reference to the description. It is therefore intended that the appended claims encompass any such modifications or embodiments.

We claim:

1. An infrared sensing device, said device comprising:
   thermally sensitive picture elements within a substrate;
   bias contact areas within said substrate and around a periphery of said thermally sensitive picture elements;
   a common electrode on a front side of said thermally sensitive picture elements and said bias contact areas;
   an optical coating on top of said common electrode;
   a first electrical contact metal on a backside of said thermally sensitive picture elements; and
   a second electrical contact metal connected to said bias contact areas on a backside of said bias contact areas and electrically connected to said common electrode.

2. The device of claim 1, wherein said bias contact areas include a conductive substrate area.

3. The device of claim 1, wherein said device is connected to an integrated circuit by an ohmic connection to said second electrical contact metal.

4. The device of claim 1, wherein said device is connected to an integrated circuit by an ohmic connection to said first electrical contact metal.

5. An infrared detector, said detector comprising:
   thermally sensitive picture elements within a substrate;
   bias contact areas within said substrate and around a periphery of said thermally sensitive picture elements wherein said bias contact areas include a conductive substrate area;
   a common electrode on a front side of said thermally sensitive picture elements and said bias contact areas;
   an optical coating on top of said common electrode;
   a first electrical contact metal on a backside of said thermally sensitive picture elements and
   a second electrical contact metal connected to exposed portions of said bias contact areas on a backside of said bias contact areas and electrically connected to said common electrode.

6. The detector of claim 5, wherein said detector is connected to an integrated circuit by an ohmic connection to said first electrical contact metal.

7. The detector of claim 5, wherein said detector is connected to an integrated circuit by ohmic connection to said second electrical contact metal.

* * * * *